US009899292B2

(12) United States Patent
Chiu et al.

(10) Patent No.: US 9,899,292 B2
(45) Date of Patent: Feb. 20, 2018

(54) TOP-SIDE COOLING OF RF PRODUCTS IN AIR CAVITY COMPOSITE PACKAGES

(71) Applicant: Qorvo US, Inc., Greensboro, NC (US)

(72) Inventors: Anthony Chiu, Richardson, TX (US); Craig Steinbeiser, Allen, TX (US); Oleh Krutko, Colleyville, TX (US); John Beall, Richardson, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/231,922

(22) Filed: Aug. 9, 2016

(65) Prior Publication Data

US 2017/0229368 A1 Aug. 10, 2017

Related U.S. Application Data

(60) Provisional application No. 62/291,664, filed on Feb. 5, 2016.

(51) Int. Cl.
*H01L 33/00* (2010.01)
*H01L 23/367* (2006.01)
(Continued)

(52) U.S. Cl.
CPC ........ *H01L 23/3675* (2013.01); *H01L 23/055* (2013.01); *H01L 23/552* (2013.01);
(Continued)

(58) Field of Classification Search
CPC .................. H05K 7/20963; H05K 7/20; G02F 1/133603; G02F 1/133621;
(Continued)

(56) References Cited

U.S. PATENT DOCUMENTS

| | | | | |
|---|---|---|---|---|
| 9,113,549 | B2 | 8/2015 | Steinbeiser et al. | |
| 2012/0126280 | A1* | 5/2012 | Lee ....................... | H01L 33/642 257/99 |
| 2017/0086337 | A1* | 3/2017 | Tokuyama ......... | H05K 7/20963 |

OTHER PUBLICATIONS

Galloway, Jesse E., "Thermal Analysis of Portable Electronic Products," The Sixth Intersociety Conference on Thermal and Thermomechanical Phenomena in Electronic Systems, 1998, ITHERM '98, May 27-30, 1998, pp. 1-7.

(Continued)

*Primary Examiner* — Charles Garber
*Assistant Examiner* — Abdulfattah Mustapha
(74) *Attorney, Agent, or Firm* — Withrow & Terranova, P.L.L.C.

(57) ABSTRACT

Top-side cooling of Radio Frequency (RF) products in air cavity packages is provided. According to one aspect, an air cavity package comprises a substrate, a RF component mounted to the substrate, and a lid structure comprising a first material and being mounted to the substrate that covers the RF component such that a cavity is formed within the lid structure and about the RF component. At least one opening is provided in a top portion of the lid. The air cavity package also comprises a heat transfer structure comprising a second material and comprising a heat path extending from the top surface of the substrate through the opening(s) in the lid to the top outer surface of the air cavity package to provide a top-side thermal interface. In one embodiment, the lid is comprised of a molded material that absorbs RF signals and the heat transfer structure is metal.

20 Claims, 7 Drawing Sheets

(51) Int. Cl.
*H01L 23/055* (2006.01)
*H01L 23/66* (2006.01)
*H01L 23/552* (2006.01)
*H01L 23/498* (2006.01)

(52) U.S. Cl.
CPC ........ *H01L 23/66* (2013.01); *H01L 23/49827* (2013.01); *H01L 2223/6616* (2013.01); *H01L 2223/6683* (2013.01); *H01L 2224/48091* (2013.01); *H01L 2224/73265* (2013.01); *H01L 2924/16153* (2013.01)

(58) Field of Classification Search
CPC ... G02F 1/133308; G02F 2001/133628; G02F 2001/133314; G02F 1/1333; G02F 1/1335
See application file for complete search history.

(56) References Cited

OTHER PUBLICATIONS

Hai, Yang et al., "Thermal Simulation for the Packaging Structures of Radio Frequency Power Amplifier Chamber," 2012 International Conference on Electronic Packaging Technology and High Density Packaging (ICEPT-HDP), Aug. 13-16, 2012, pp. 735-738.

Inoue, Hirokazu et al., "Cavity Down AIN PGA With Inter-Polyimide Wiring," Proceedings of the 39th Electronic Components Conference, May 22-24, 1989, pp. 513-517.

Zhou, Jing et al., "Heat Dissipation Design for a High Density-High Power Chip Package," 2011 12th International Conference on Electronic Packaging Technology and High Density Packaging (ICEPT-HDP), Aug. 8-11, 2011, pp. 556-559.

* cited by examiner

TOP-SIDE COOLING OF RF PRODUCTS IN AIR CAVITY COMPOSITE PACKAGES

RELATED APPLICATIONS

This application claims the benefit of provisional patent application Ser. No. 62/291,664, filed Feb. 5, 2016, the disclosure of which is hereby incorporated herein by reference in its entirety.

TECHNICAL FIELD

The present disclosure relates to air cavity composite packages with top-side cooling and low-inductance leads suitable for use by Radio Frequency (RF) products.

BACKGROUND

Air cavity packages are used to minimize dielectric loading effects that limit the bandwidth of high-frequency semiconductor devices. In conventional surface-mount air cavity packages, the semiconductors are mounted on a substrate including metal geometries that conduct heat downward, from the bottom of the Integrated Circuit (IC) to the bottom of the package. High frequency electrical signals are typically distributed to the side of the package. The package is in turn mounted to an application board, which serves the dual purposes of (a) routing Radio Frequency (RF) signals and Direct Current (DC) power to the package and (b) conducting heat away from the package. Traditional laminate air cavity RF packages dissipate heat from the bottom side. The active semiconductor die, typically Microwave Monolithic Integrated Circuits (MMICs), are mounted on a substrate made of fiberglass material. The active side of the MMICs faces the air. The heat from the MMICs is removed downward: from the bottom side of the MMIC, through the die attach material, the top metal layer on the substrate, thermal vias in the substrate, and then to an external heat sink. An example conventional surface-mounted air cavity package is shown in FIG. 1.

FIG. 1 illustrates a conventional multi-channel air cavity laminate module with a lid and a bottom-side heat path. In the embodiment illustrated in FIG. 1, a conventional laminate air cavity package 10 is mounted to an application board 12, typically by soldering. The solder joints joining the conventional air cavity package 10 to the application board 12 are shown as black-filled rectangles in FIG. 1. Within the conventional laminate air cavity package 10, devices 14 are mounted to a substrate 16 that includes both electrical vias 18 and thermal vias 20. A single via may function both as an electrical via and a thermal via. The electrical vias 18 provide electrical connections between pads on the device 14 and traces on or within the application board 12. In one embodiment, the device 14 is connected to the electrical vias 18 via wire bonds 22. The thermal vias 20 provide a conductive heat path between the device 14 so that heat can be transferred away from the device 14 and into the application board 12, e.g., via a heat transfer path 24. This approach is referred to as "bottom-side" cooling. For bottom-side cooling, the application board 12 must absorb and dissipate heat as well as route the RF and DC signals. Because the devices 14 are mounted to the inner surface of the air cavity package 10 closest to the application board 12, this configuration is referred to as having "bottom-mounted" devices. A lid 26 covers the devices 14 and forms one or more air cavities.

Some application boards, however, are designed for RF signal and DC power routing only and cannot provide a suitable bottom-side heat path. For these application boards, the conventional bottom-side cooling approach shown in FIG. 1 is unworkable.

Another conventional approach directs heat flow upward away from the application board 12, an approach referred to as "top-side cooling." Applications requiring top-side cooling have made use of specially constructed Ball Grid Array (BGA) packages in which the MMIC or other device is attached to a heat sink on the top of the package. An example of this is shown in FIG. 2.

FIG. 2 illustrates a conventional BGA package with top-side cooling. In FIG. 2, an air cavity laminate package 28 contains the device 14 mounted to a metal base 30 that functions to transfer heat away from the devices 14 to the surrounding air instead of going into the application board 12. A lid 32 covers the devices 14 and forms one or more air cavities. The lid 32 also provides the electrical vias 18 that electrically connect pads to the devices 14 to traces on or within the application board 12. In the embodiment illustrated in FIG. 2, the laminate package 28 is attached to the application board 12 via solder balls, which are shown as black-filled circles in FIG. 2. The electrical vias 18 may be connected to the pads of the devices 14 via the wire bonds 22. Because the devices 14 are mounted to the inner surface of the package that is farthest from the application board 12, this configuration is referred to as having "top-mounted" devices.

Due to the position of the devices 14 at some distance away from the application board 12, however, the electrical vias 18 must be routed horizontally from the pins of the device 14 to the vertical portions of the lid 32, down through those vertical portions of the lid 32, and horizontally again to the application board 12. This creates electrical vias 18 that are relatively long, which results in increased inductance (L), resistance (R), and/or capacitance (C). RF circuits particularly may not be able to tolerate the additional L, R, or C, in which case the BGA package shown in FIG. 2 is unsuitable for higher frequency RF modules.

Thus, there is a need for air cavity laminate packages with top-side cooling that are suitable for use by RF devices and circuits.

SUMMARY

Top-side cooling of Radio Frequency (RF) products in air cavity packages is provided. According to one aspect, an air cavity composite package comprises a substrate, a RF component mounted to the substrate, and a lid structure comprising a first material and being mounted to the substrate, that covers the RF component such that a cavity is formed within the lid structure and surrounding (e.g., above and around the sides of, and possibly under) the RF component. At least one opening is provided in a top portion of the lid. The air cavity composite package also comprises a heat transfer structure comprising an extending from the top surface of the substrate through the at least one opening in the lid to the top outer surface of the air cavity composite package to provide a top-side thermal interface, e.g., for an external heatsink. The heat transfer structure comprises a second material different from the first material.

In one embodiment, the substrate contains signal carrying components and the lid contains no signal carrying components. In one embodiment, the substrate comprises a horizontal heat spreader and both the lid structure and the RF component are mounted to the horizontal heat spreader. In one embodiment, the substrate comprises a thermally insulating layer that prevents or reduces heat flow to the bottom side of the air cavity composite package. In one embodiment, the substrate comprises heat transfer structures that provide or enhance heat flow to the bottom side of the air cavity composite package.

In one embodiment, the RF component comprises an integrated circuit die. In one embodiment, the RF component operates as a radio frequency transmitter or receiver.

In one embodiment, the lid comprises a top structure that includes the at least one opening and at least one side wall that extends from the top structure to the substrate. In one embodiment, the lid is comprised of a molded component. In one embodiment, the lid is comprised of insulating or RF absorptive materials to control reflections and transmissions within the cavity.

In one embodiment, the heat transfer structure is comprised of metal. In one embodiment, the heat path contacts the top surface of the substrate proximate to the RF component. In one embodiment, the heat path forms an internal wall of the package. In one embodiment, the heat transfer structure is a component of an external wall of the package. In one embodiment, the top-side thermal interface comprises fins.

In one embodiment, the top-side thermal interface resides over a top portion of the lid structure, e.g., forming a "T-shaped" cross-section. In one embodiment, the heat transfer structure comprises a plurality of heat paths, each of the plurality of heat paths extending from the top-side thermal interface through a respective one of the at least one openings in the lid. For example, the heat transfer structure includes two heat paths which extend to the top-side thermal interface such that the heat transfer structure has a Pi-shaped ("Tr-shaped") cross-section.

In one embodiment, wherein the lid structure, the heat path, and substrate form a plurality of cavities, each cavity having a respective RF component mounted to the substrate within the cavity. In one embodiment, each RF component operates as a radio frequency transmit or receive channel such that each channel is contained within its separate respective cavity.

According to another aspect, a method for top-side cooling of RF products in air cavity composite packages comprises providing a substrate, mounting a RF component to the substrate, and mounting to the substrate a lid structure comprising a first material and covering the RF component such that a cavity is formed within the lid structure and about the RF component and where at least one opening is provided in a top portion of the lid. A heat transfer structure is provided, the heat transfer structure comprising a heat path extending from the top surface of the substrate through the at least one opening in the lid to the top outer surface of the air cavity composite package to provide a top-side thermal interface. The heat structure comprises a second material different from the first material.

Those skilled in the art will appreciate the scope of the present disclosure and realize additional aspects thereof after reading the following detailed description in association with the accompanying drawings.

BRIEF DESCRIPTION OF THE DRAWINGS

The accompanying drawing figures incorporated in and forming a part of this specification illustrate several aspects of the disclosure and, together with the description, serve to explain the principles of the disclosure.

DETAILED DESCRIPTION

Electrical systems require an efficient method to remove the heat generated by the chips (integrated circuits, or "IC"s). These systems will fail when the chips are overheated. Air cavity packages are used to minimize dielectric loading effects that limit the bandwidth of high-frequency semiconductor devices. In conventional surface-mount air cavity packages, the semiconductors are mounted on a substrate including metal geometries that conduct heat downward, from the bottom of the IC to the bottom of the package. The package is in turn mounted to an application board, which serves the dual purposes of (a) routing Radio Frequency (RF) signals and Direct Current (DC) power to the package and (b) conducting heat away from the package. Thus, conventional air cavity packages require heat sinks at the side closest to the semiconductor devices, which are usually located at the bottom of the package, i.e., the side of the package that is mated to the application board.

Some application boards are designed for RF signal and DC power routing only and cannot provide a suitable heat path. In these environments, the heat path must be through the top of the package, either by convection and radiation, or through a top-side thermal interface designed to conduct heat from the top surfaces of the packaged semiconductor devices.

The present disclosure relates to methods and systems to remove heat from the substrate, very close to the bottom-mounted devices, to the top-side of the package. This approach is suitable for use by RF devices and circuits and also suitable for use where there is no provision for bottom-side cooling, e.g., for pluggable modules. In a typical application, a "T-shaped" or Pi-shaped ("π-shaped") thermally conductive element is placed adjacent to a chain of amplifiers (e.g., chips). Examples of thermally conductive material include, but are not limited to, copper, aluminum, other metals, and thermally conductive ceramics, such as Aluminum Nitride (AlN). This element is joined by a conductive material such as epoxy or solder to the substrate on which the chips are mounted. Heat flows from the chip to the substrate to the thermally conductive element and then to an external heat sink. The thermally conductive element can be inserted into a lid and jointed by epoxy as a preassembled component. The lid material can be plastic, fiberglass, or absorptive material. The placement of the thermally conductive structure does not increase the RF trace length, and therefore ensures the maximum operating bandwidth.

Figure 3:
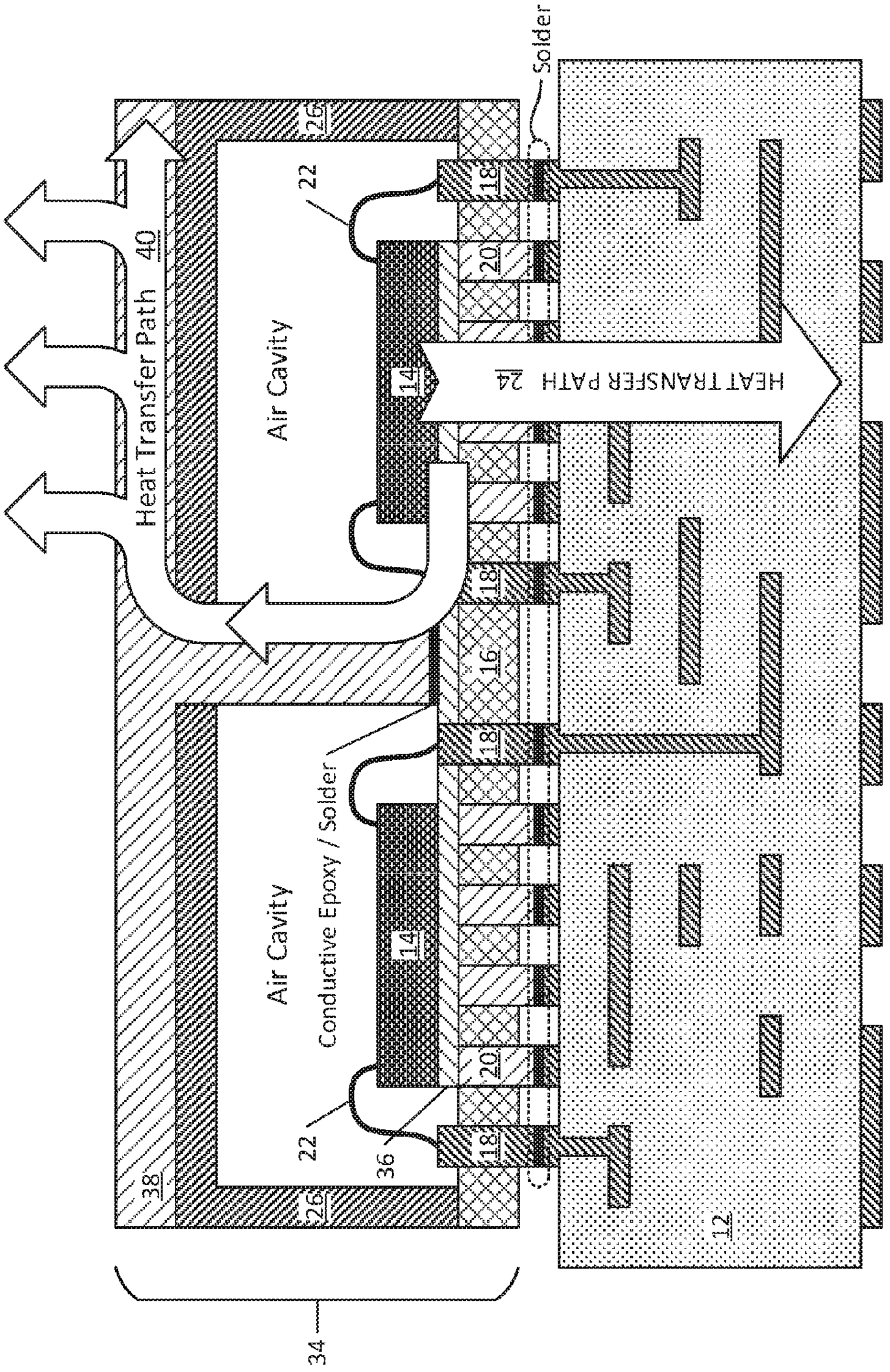
FIG. 3 illustrates an exemplary air cavity composite package with top-side cooling and bottom-mounted devices according to an embodiment of the subject matter described herein, showing both top-side and bottom-side heat paths.

FIG. 3 illustrates an exemplary air cavity composite package with top-side cooling according to an embodiment of the subject matter described herein. In the embodiment illustrated in FIG. 3, the air cavity composite package 34 is mounted to the application board 12, e.g., via solder joints, shown as black-filled rectangles in FIG. 3. Within the air cavity composite package 34, the devices 14 are mounted to the substrate 16 that includes both the electrical vias 18, which provide electrical connections between pads on the device 14 and traces on or within the application board 12, and the thermal vias 20. In one embodiment, the device 12 is connected to the electrical vias 18 via the wire bonds 22. The thermal vias 20 provide a conductive heat path between the device 14 so that heat can be transferred away from the device 14 and into the application board 12, e.g., via the heat transfer path 24. The lid 26 covers the devices 14 and forms one or more air cavities.

In the embodiment illustrated in FIG. 3, the lid 26 creates an air cavity over each of the devices 14. In one embodiment, the lid 26 is designed to provide an air cavity over a collection of devices, such as an air cavity over each channel of a multichannel transceiver. The air cavities above the semiconductor die 14 serve to minimize dielectric loading on the high-frequency semiconductor die and to provide room for the wire bonds 22 and other components inside the air cavity composite package 34. The lid 26 material may be made of insulating material or RF absorptive material to minimize reflection and transmission. Many applications require multiple channels, and the lid material can be compartmentalized to provide RF isolation between channels.

In the embodiment illustrated in FIG. 3, the thermal vias 20 extend from a heat spreader plate 36 below the devices 14. An additional heat transfer structure 38 is present to draw heat from the heat spreader plate 36 up to the top of the air cavity composite package 34. Thus, in addition to the bottom-side heat transfer path 24, the air cavity composite package 34 provides a top-side heat transfer path 40. The heat transfer structure 38 may interface with an active or passive heat exchanger for increased heat transfer capacity. In one embodiment, a conductive epoxy, solder, or other thermally conductive material may be used to provide a good interface between the heat transfer structure 38 and whatever component with which the heat transfer structure 38 is interfacing.

Figure 1:
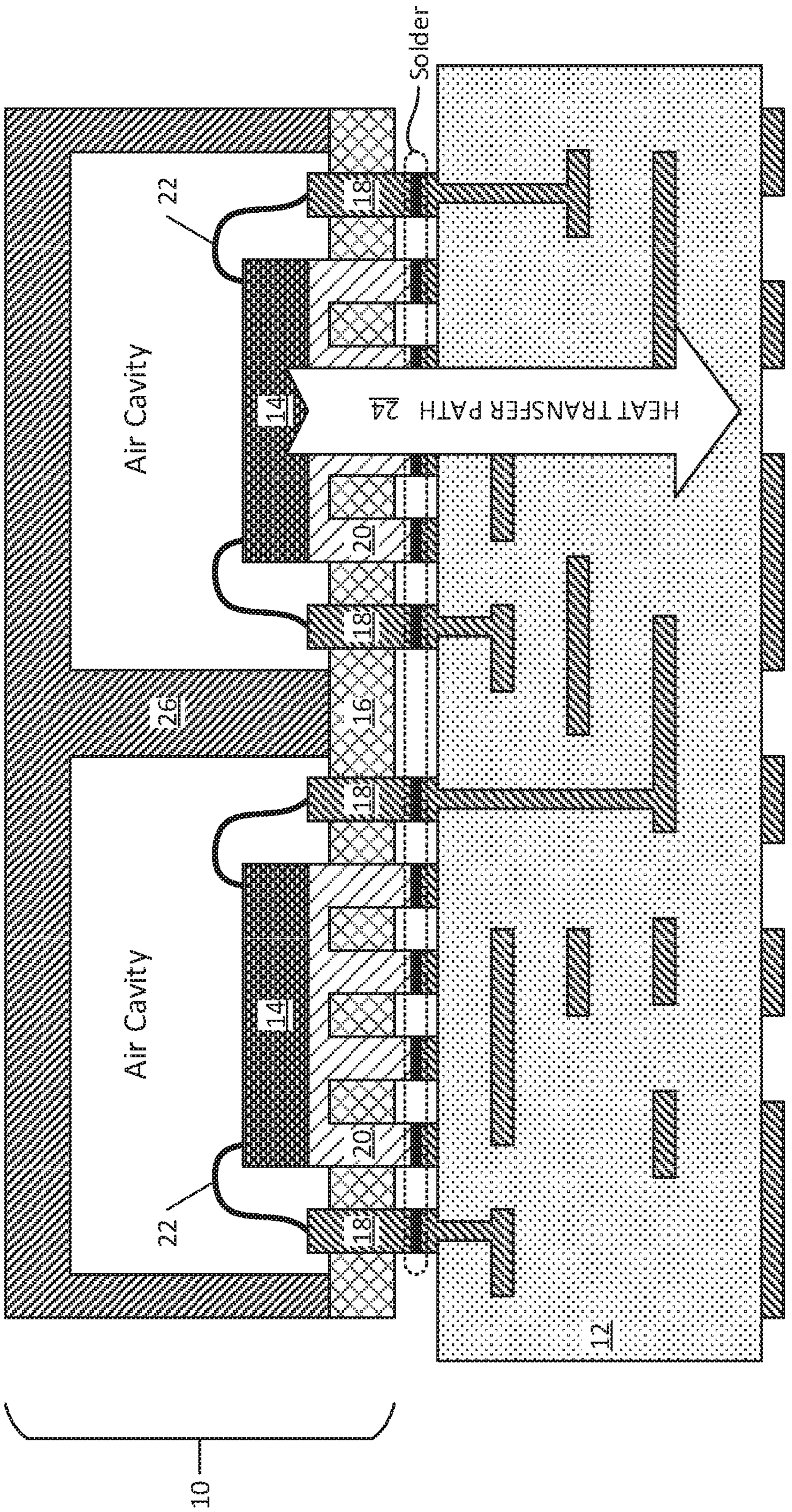
FIG. 1 illustrates a conventional multi-channel air cavity package with bottom-side cooling.
Figure 2:
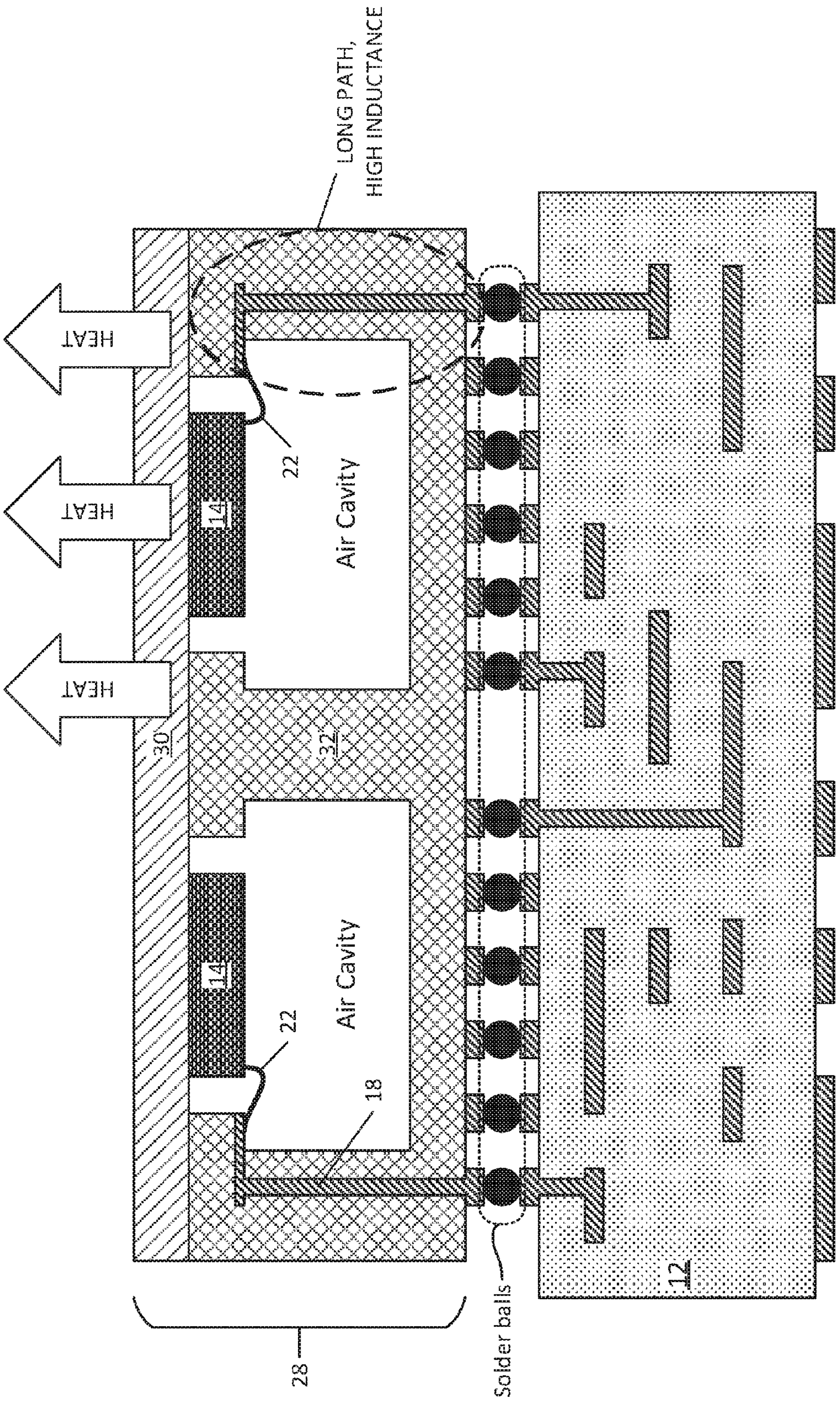
FIG. 2 illustrates a conventional Ball Grid Array (BGA) package with top-side cooling.

The 3 dB bandwidth of air cavity composite package 34 is between 0 to 60 GHz. In comparison, the BGA package 28 is typically limited to less than 10 GHz. The improvement in RF performance is a result of the minimal trace length between the IC and the application board. In modern data communication and telecommunication systems, the typical data rate is 20 to 60 GHz per channel. The transceivers are housed in a pluggable housing, without heatsinking on the application board. Unlike the conventional packages shown in FIGS. 1 and 2, the air cavity composite packages shown in FIGS. 3-7 meet the performance requirements for this type of communication systems.

Figure 4:
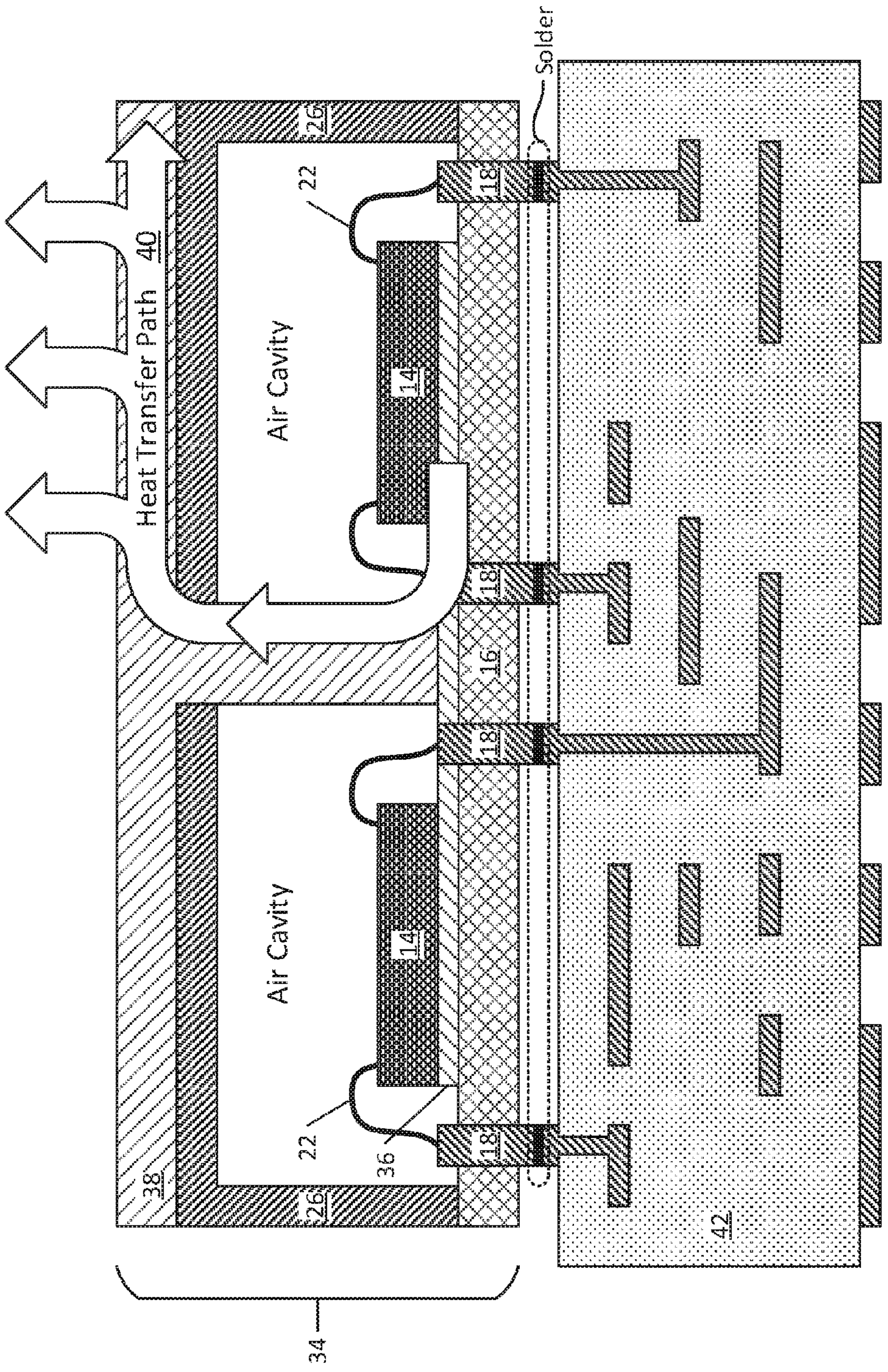
FIG. 4 illustrates an exemplary air cavity composite package with top-side cooling and bottom-mounted devices according to another embodiment of the subject matter described herein, showing only a top-side heat path.

FIG. 4 illustrates an exemplary air cavity composite package with top-side cooling according to another embodiment of the subject matter described herein. In the embodiment illustrated in FIG. 4, the air cavity composite package 34 is soldered to an application board 42 that is designed for RF signal and DC power routing only, and cannot provide a suitable heat path. In the embodiment illustrated in FIG. 4, the substrate 16 includes the electrical vias 18 but no thermal vias. In this embodiment, heat from the devices 14 travels through the heat spreader plate 36 and up through the heat transfer structure 38 via the heat transfer path 40. In this configuration, heat transferred downward into the application board 42 is reduced or prevented entirely.

In one embodiment, the heat transfer structure 38 comprises a high thermal conductivity material such as the thermally conductive materials listed above. The design retains the flexibility to use a portion of the lid 26 for insulating or RF absorptive material while allowing heat to flow upward. In one embodiment, heat flows horizontally using metal geometries on the package substrate and then upward through one or more of the package walls. The horizontal path in the substrate may consist of either conventional printed circuit board (PCB) traces or conductive material attached to the surface of the PCB for the purpose of lateral heat conduction, such as the heat spreader plate 36. The top surface of the air cavity composite package 34 may be used to dissipate heat by radiation or convection, or to mate with a heat sink in the application module. This approach frees the application board 42 from any need to conduct heat, so that the board design can focus on RF and DC signal routing only.

Figure 5:
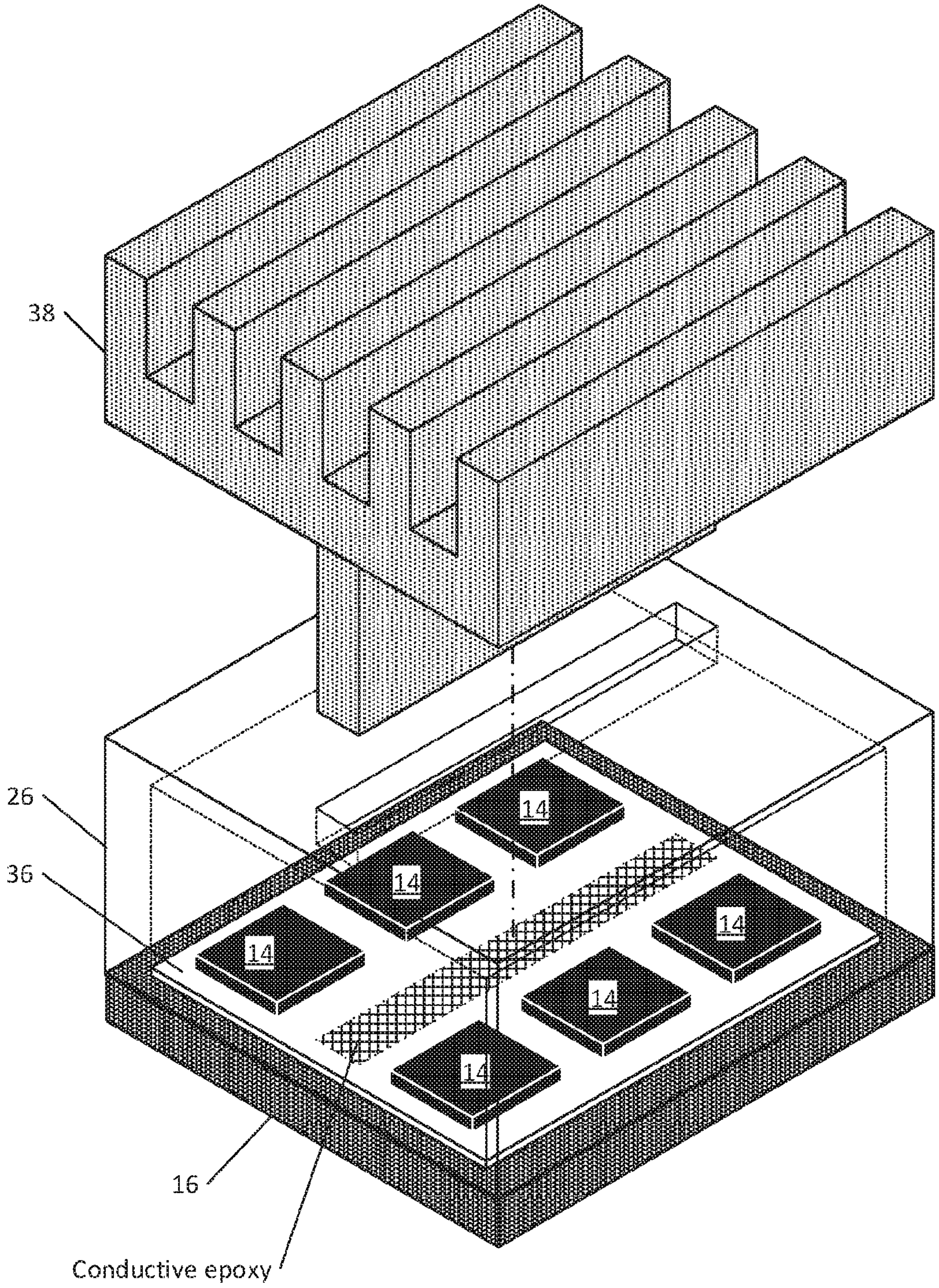
FIG. 5 illustrates an exemplary air cavity composite package with top-side cooling and bottom-mounted devices according to another embodiment of the subject matter described herein, showing a "T-shaped" cross-section with cooling fins.

FIG. 5 illustrates a partially-exploded isometric view of an exemplary air cavity composite package with top-side cooling according to another embodiment of the subject matter described herein. In the embodiment illustrated in FIG. 5, the heat transfer structure 38, which is generally "T-shaped" in cross section, includes cooling fins. The lid 26 is transparent to show example locations of the devices 14 and the heat spreader plate 36 atop the substrate 16. When the heat transfer structure 38 and the remaining portions of the air cavity package illustrated in FIG. 5 are assembled, the metal protrusion at the bottom of the heat transfer structure 38 would extend through the slot in the top of the lid 26 and contact the top surface of the heat spreader plate 36, forming the internal heat path to conduct heat upward and away from the devices 14.

Figure 6:
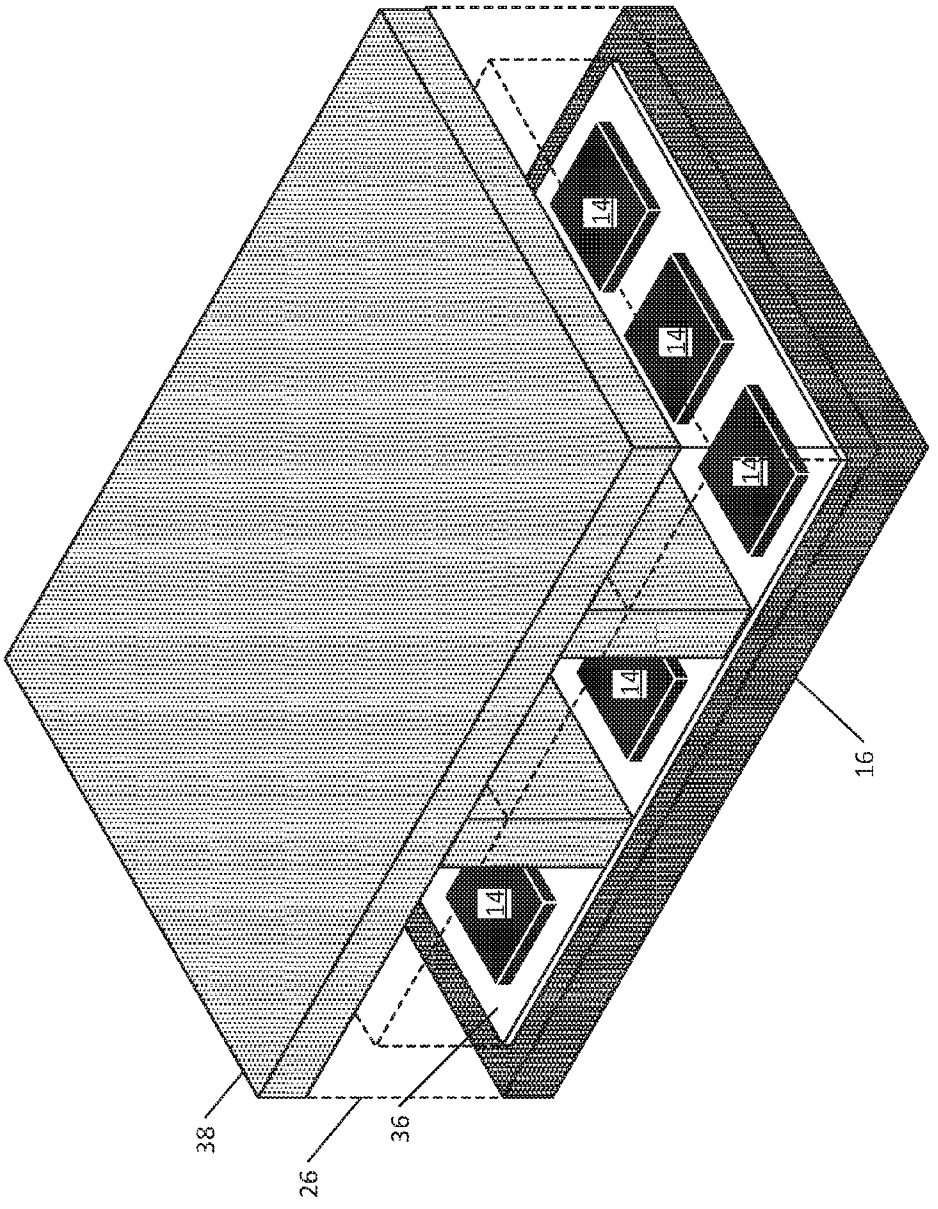
FIG. 6 illustrates an exemplary air cavity composite package with top-side cooling and bottom-mounted devices according to another embodiment of the subject matter described herein, showing a Pi-shaped ("Tr-shaped") cross-section without cooling fins.

FIG. 6 illustrates an isometric view of an exemplary air cavity composite package with top-side cooling according to another embodiment of the subject matter described herein. In the embodiment illustrated in FIG. 6, the heat transfer structure 38 is generally "π-shaped" in cross section. The lid 26 is transparent to show example locations of the devices 14 and the heat spreader plate 36 atop substrate 16.

Figure 7:
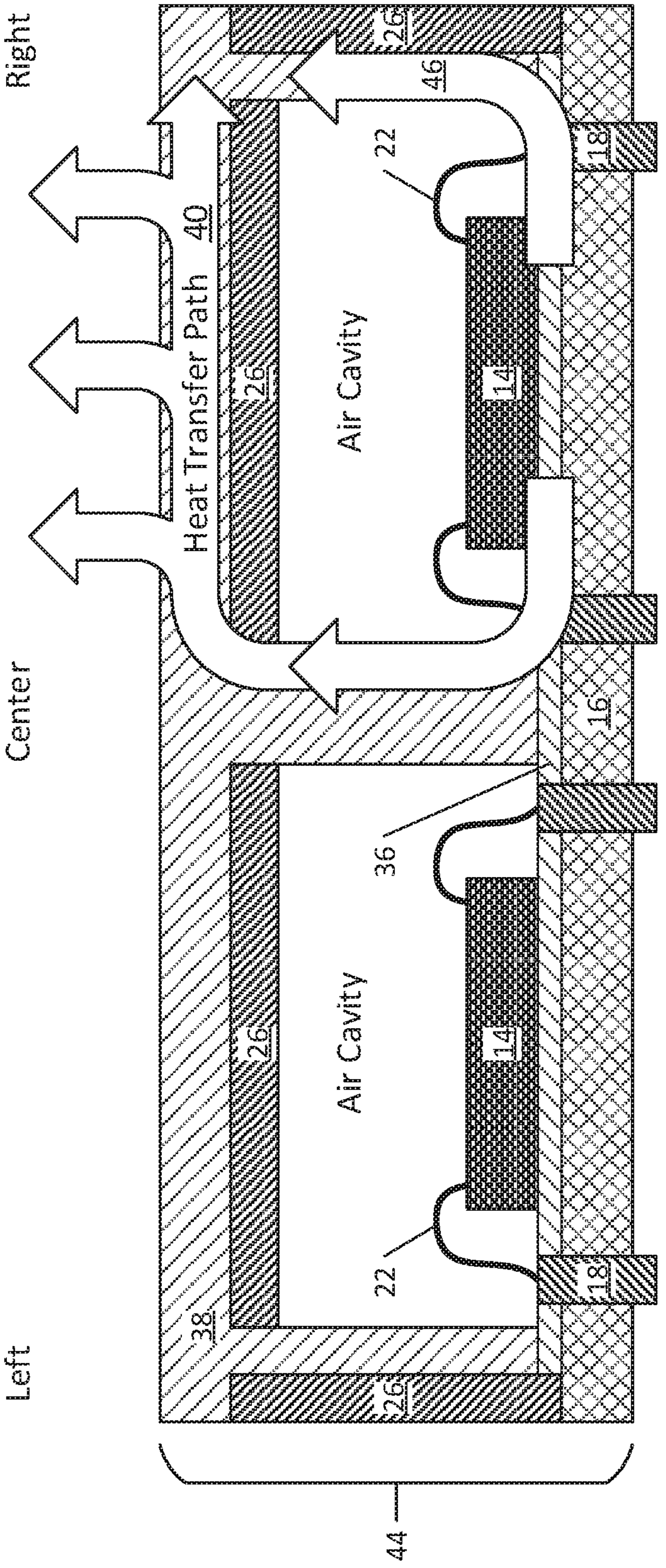
FIG. 7 illustrates an exemplary air cavity composite package with top-side cooling according to another embodiment of the subject matter described herein, showing an "m-shaped" cross-section having internal heat paths near the package outer walls.

FIG. 7 illustrates an exemplary air cavity composite package 44 with top-side cooling according to another embodiment of the subject matter described herein. In the embodiment illustrated in FIG. 7, the heat transfer structure 38 has three internal vertical heat paths: one in the center of the air cavity package 44, one on the left side of the air cavity package 44, and one on the right side of the air cavity package 44. FIG. 7 illustrates the point that the internal heat paths may be near the outside walls of the air cavity package 44, and are not restricted to being just in the center of the package. This provides additional vertical internal heat paths, such as a heat path 46 shown in FIG. 7.

The embodiments described above are intended to be illustrative and not limiting. For example, there are multiple approaches to cool the Microwave Monolithic Integrated Circuits (MMIC) from the top-side without deviating from the concepts of the present disclosure. The heat transfer structure 38 may touch the substrate 16 and/or the heat spreader plate 36 in any number of locations, not just the "T-shaped" and "Tr-shaped" configurations seen in FIGS. 5 and 6. The heat transfer structure 38 may be used with or without substrate thermal vias, with or without substrate metal planes, and with or without an added horizontal heat spreader. The exemplary air cavity packages described herein may have multiple heat transfer structures 38. The concepts described herein may be scaled up—for example, the air cavity composite package 34 may have multiple air cavities, each cavity being for a single channel or multiple channels. Other such variations will be obvious to those skilled in the art, and are considered to be within the scope of the present disclosure.

The present disclosure provides for, but is not limited to, the following:

An air cavity package with a vertical heat path incorporated into one or more internal walls and a top surface provided to interface with top-side heat removal in the application, constructed to enable placement of the vertical heat path close to the active MMICs.

An air cavity package with a vertical heat path incorporated into one or more external walls.

A vertical heat path consisting of low-cost thermally conductive material, such as copper, aluminum, other metals, or thermally conductive ceramics.

Vertical heat path and heat spreader in an "I," "T," "π," or finned configuration.

Heat spreader connected to the MMIC using one or more s: (a) the substrate thermal via, (b) the substrate copper or other thermally conductive plane, or (c) the added horizontal thermal spreader.

An air cavity package with a vertical heat path into one or more internal walls and a top surface provided to interface with top-side heat removal in the application, in combination with insulating or RF absorptive materials to control reflections and transmissions within the cavity.

An air cavity package with a vertical heat path incorporated into one or more internal walls, a top surface provided to interface with top-side heat removal in the application, and a thermally insulated layer to reduce heat flow to the bottom side of the package. This insulated layer is formed as part of the substrate by not extending the thermal vias under the chips on the top surface all the way to the bottom surface of the substrate. This insulating layer prevents the chips on the bottom side from overheating and allows the chips on the top-side of the substrate to dissipate the heat generated from operation.

Those skilled in the art will recognize improvements and modifications to the present disclosure. All such improvements and modifications are considered within the scope of the concepts disclosed herein.

What is claimed is:

1. An air cavity composite package, comprising:

a substrate;

a radio frequency (RF) component mounted to the substrate;

a lid structure comprising a first material and being mounted to the substrate and covering the RF component such that a cavity is formed within the lid structure and about the RF component, wherein at least one opening is provided in a top portion of the lid; and a heat transfer structure, proximate to the RF component, comprising a heat path extending from a top surface of the substrate through the at least one opening in the lid to a top outer surface of the air cavity package to provide a top-side thermal interface, the heat transfer structure comprising a second material different from the first material.

2. The air cavity composite package of claim 1 wherein the substrate contains signal carrying components and the lid contains no signal carrying components.

3. The air cavity composite package of claim 1 wherein the substrate comprises a horizontal heat spreader and both of the lid structure and the RF component are mounted to the horizontal heat spreader.

4. The air cavity composite package of claim 1 wherein the substrate comprises a thermally insulating layer that prevents or reduces heat flow to a bottom side of the air cavity package.

5. The air cavity composite package of claim 1 wherein the substrate comprises heat transfer structures that provide or enhance heat flow to a bottom side of the air cavity package.

6. The air cavity composite package of claim 1 wherein the RF component comprises a chip die.

7. The air cavity composite package of claim 1 wherein the RF component operates as a radio frequency transmit or receive channel.

8. The air cavity composite package of claim 1 wherein the lid comprises a top structure that includes the at least one opening and at least one side wall that extends from the top structure to the substrate.

9. The air cavity composite package of claim 1 wherein the lid is comprised of a molded component.

10. The air cavity composite package of claim 1 wherein the first material is comprised of insulating or RF absorptive materials to control reflections and transmissions within the cavity.

11. The air cavity composite package of claim 1 wherein the heat transfer structure is comprised of metal.

12. The air cavity composite package of claim 1 wherein the heat path contacts the top surface of the substrate proximate to the RF component.

13. The air cavity composite package of claim 1 wherein the heat path forms an internal wall of the package.

14. The air cavity composite package of claim 1 wherein the heat path is a component of an external wall of the package.

15. The air cavity composite package of claim 1 wherein the top-side thermal interface comprises fins.

16. The air cavity composite package of claim 1 wherein the top-side thermal interface resides over the top portion of the lid structure.

17. The air cavity composite package of claim 16 wherein the heat transfer structure comprises a plurality of heat paths, each of the plurality of heat paths extending from the top-side thermal interface through a respective one of the at least one openings in the lid.

18. The air cavity composite package of claim 1 wherein the lid structure, heat transfer structure, and substrate form a plurality of cavities, each cavity having a respective RF component mounted to the substrate within the cavity.

19. The air cavity composite package of claim 18 wherein each RF component operates as a RF transmit or receive channel such that each channel is contained within its separate respective cavity.

20. A method for top-side cooling of Radio Frequency (RF) products in air cavity packages, the method comprising:

providing a substrate;

mounting a RF component to the substrate;

mounting to the substrate a lid structure comprising a first material and covering the RF component such that a cavity is formed within the lid structure and about the RF component, wherein at least one opening is provided in a top portion of the lid; and providing a heat transfer structure comprising a heat path extending from a top surface of the substrate through the at least one opening in the lid to a top outer surface of the air cavity package to provide a top-side thermal interface, the heat transfer structure comprising a second material different from the first material.

* * * * *

UNITED STATES PATENT AND TRADEMARK OFFICE
CERTIFICATE OF CORRECTION

| | |
|---|---|
| PATENT NO. | : 9,899,292 B2 |
| APPLICATION NO. | : 15/231922 |
| DATED | : February 20, 2018 |
| INVENTOR(S) | : Anthony Chiu et al. |

It is certified that error appears in the above-identified patent and that said Letters Patent is hereby corrected as shown below:

In the Specification

In Column 3, Line 35, replace "("Tr-shaped")" with --("π-shaped")--.

In Column 4, Line 21, replace "("Tr-shaped")" with --("π-shaped")--.

Signed and Sealed this
Tenth Day of April, 2018

Andrei Iancu
*Director of the United States Patent and Trademark Office*